United States Patent [19]
Tsai et al.

[11] Patent Number: 5,930,593
[45] Date of Patent: Jul. 27, 1999

[54] METHOD FOR FORMATING DEVICE ON WAFER WITHOUT PEELING

[75] Inventors: Cheng-Hsun Tsai; Yui-Ping Huang; Mao-Song Tseng; Yuan-Lung Lin, all of Hsinchu, Taiwan

[73] Assignee: Mosel Vitelic Inc., Taiwan

[21] Appl. No.: 08/895,430

[22] Filed: Jul. 16, 1997

[30] Foreign Application Priority Data

Dec. 19, 1996 [TW] Taiwan ................................. 85115719

[51] Int. Cl.⁶ .................................................. H01L 21/00
[52] U.S. Cl. ................... 438/50; 438/14; 438/48
[58] Field of Search ................... 438/14, 50, 48

[56] References Cited

U.S. PATENT DOCUMENTS

| | | | |
|---|---|---|---|
| 4,188,258 | 2/1980 | Mounteer et al. ........................ | 438/50 |
| 5,164,338 | 11/1992 | Graeger et al. ........................... | 438/50 |
| 5,472,916 | 12/1995 | Bertagnolli et al. ..................... | 438/50 |
| 5,520,785 | 5/1996 | Evans et al. .............................. | 438/50 |
| 5,571,746 | 11/1996 | Pan ........................................... | 438/612 |
| 5,616,523 | 4/1997 | Benz et al. ............................... | 438/50 |
| 5,618,380 | 4/1997 | Stems et al. . | |
| 5,620,929 | 4/1997 | Hosoi et al. .............................. | 438/50 |
| 5,620,931 | 4/1997 | Tsang et al. .............................. | 438/50 |
| 5,783,482 | 7/1998 | Lee et al. . | |

*Primary Examiner*—Kevin M. Picardat
*Assistant Examiner*—Deven Collins
*Attorney, Agent, or Firm*—Chapman and Cutler

[57] ABSTRACT

The present invention provides a method for forming a device on a wafer without peeling, in which the wafer has a substrate forming thereon a first dielectric layer forming thereon a first conducting layer having thereon a device area and an edge area. This method includes steps of a) forming a second dielectric layer on the device area and the edge area, b) forming a photoresist layer on the second dielectric layer, c) selectively removing the second dielectric layer, the photoresist layer, and the first conducting layer from and presenting thereby the device area and the edge area with a desired dielectric layer, and d) forming a metal film on the device area and the edge area.

23 Claims, 14 Drawing Sheets

METHOD FOR FORMATING DEVICE ON WAFER WITHOUT PEELING

FIELD OF THE INVENTION

The present invention is related to a method for forming device on wafer without peeling, and more particularly to a method for forming device on wafer without peeling on edge area.

BACKGROUND OF THE INVENTION

For processing semiconductors, hundreds of steps will be taken on the center region to form a device area. This area includes many basic units, such as MOS structures. The edge area of wafer is not concerned and raw materials of processing are left on it. This leftover does not affect performance of the units. During high temperature reaction, however, it is transformed into other material which has different thermal expansion coefficient from dielectric materials under it. During thermal treat process, it causes peeling phenomenon on the edge area of wafer and contaminates the whole system.

For example, in tungsten plug manufacturing process, dielectric layer and polysilicon layer which is over the dielectric layer are left on edge area of wafer. Titanic film is deposited over the polysilicon layer as glue layer. Titanium nitride (TiN) film is formed by rapid thermal nitridation (RTN) procedure, but titanic film and polysilicon layer will react to form titanium silicide ($TiSi_2$) film simultaneously. Titanium silicide film has much different thermal expansion coefficient from dielectric layer, so titanium silicide film and titanic film will peel off dielectric layer on edge area of wafer during thermal treat process. These contaminants trouble manufacturers very much.

Polysilicon layer is left on edge area of wafer because of the use of etcher with clamps. Etching process is hampered by these clamps and a width of 2 mm polysilicon can not be etched. It is useful to employ clampless etchers in factory. But this idea does not work in practice because that it costs too much to restock new equipments. Rearranging equipments is neither suitable because of complexity of semiconductor processing.

SUMMARY OF THE INVENTION

An objective of the present invention is to provide a method for forming devices on wafer without peeling during thermal treat process by isolating the leftover layer on edge area.

Another objective of the present invention is to provide a method for forming devices on wafer without peeling during thermal treat process by removing the leftover on edge area.

In accordance with the present invention, a method for forming a device on a wafer without peeling, in which the wafer has a substrate forming thereon a first dielectric layer forming thereon a first conducting layer having thereon a first device area and an edge area, includes steps of a) forming a second dielectric layer on the first device area and the edge area, b) forming a photoresist layer on the second dielectric layer, c) selectively removing the second dielectric layer, the photoresist layer, and the first conducting layer from and presenting thereby the first device area and the edge area with a desired dielectric layer, d) forming a metal film on the first device area and the edge area, and e) forming a titanium nitride (TiN) film on the titanic film.

The method in step c) includes the following sub-steps, c1) executing a photolithography and etching procedure to etch the second dielectric layer on the first device area, and c2) removing the remaining photoresist layer on the first device area and the edge area.

In accordance with another aspect of the present invention, the first dielectric layer is preferably one selected from a group consisting of a silicon dioxide ($SiO_2$) layer, a phosphosilicate glass (PSG) layer, a borophosphosilicate glass (BPSG) layer, a thermal oxide layer, and a non-doped silicate glass (NSG) layer. The first conducting layer is a polysilicon layer.

In accordance with another aspect of the present invention, the first device area is defined by the first conducting layer forming thereon a third dielectric layer forming thereon a second conducting layer forming thereon the second dielectric layer.

In accordance with another aspect of the present invention, the step a) is preferably executed by a chemical vapor deposition (CVD) method, in the step c), the second dielectric layer is removed by a dry etching, and in the step e), the titanium nitride film is formed by rapid thermal nitridation (RTN) procedure or reactive sputtering deposition procedure.

In accordance with another aspect of the present invention, the first device area preferably forms thereon a contact hole which is covered by the metal film, e.g. titanic film. The contact hole is formed by etching the second dielectric layer, and the metal film is formed by a magnetron DC sputtering.

In accordance with another aspect of the present invention, after the step d), a step of forming a contact plug, e.g. tungsten plug, is preferably formed by blanket tungsten deposition or selective tungsten deposition in the contact hole.

In accordance with another aspect of the present invention, further includes a second device area which is preferably defined by the substrate forming thereon a third conducting layer forming thereon a fourth dielectric layer forming thereon a fourth conducting layer forming thereon the first dielectric layer.

In accordance with another aspect of the present invention, the step c) preferably further includes the following sub-steps, c3) removing the photoresist layer on the second dielectric layer on the edge area, and c4) executing a photolithography and etching procedure to etch the second dielectric layer on the first device area with an etcher having a clamp in order to maintain the second dielectric layer on the edge area.

In accordance with another aspect of the present invention, the step c) preferably further includes the following sub-steps, c5) removing the photoresist layer on the second dielectric layer on the edge area, c6) executing a photolithography and etching procedure to etch the second dielectric layer on the first device area and the edge area, and c7) simultaneously etching away the photoresist layer remained on the second dielectric layer and the first conducting layer on the edge area by a dry etching, e.g. a plasma etching technique using ozone ($O_3$).

In accordance with the present invention, a method for forming a device on a wafer without peeling, in which the wafer has a substrate forming thereon a first dielectric layer forming thereon a first conducting layer having thereon a device area and an edge area, includes steps of a) removing the first conducting layer on the edge area by dry etching, b) forming a second dielectric layer on the device area and the edge area, c) forming a photoresist layer on the second dielectric layer, d) removing the photoresist layer on the second dielectric layer on the edge area, e) executing a photolithography and etching procedure to etch the second dielectric layer, and f) forming a metal film on the device area and the edge area.

The present invention may best be understood through the following description with reference to the accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for the purpose of illustration and description only; it is not intended to be exhaustive or to be limited to the precise form disclosed.

EXAMPLE 1.

Figure 1A:
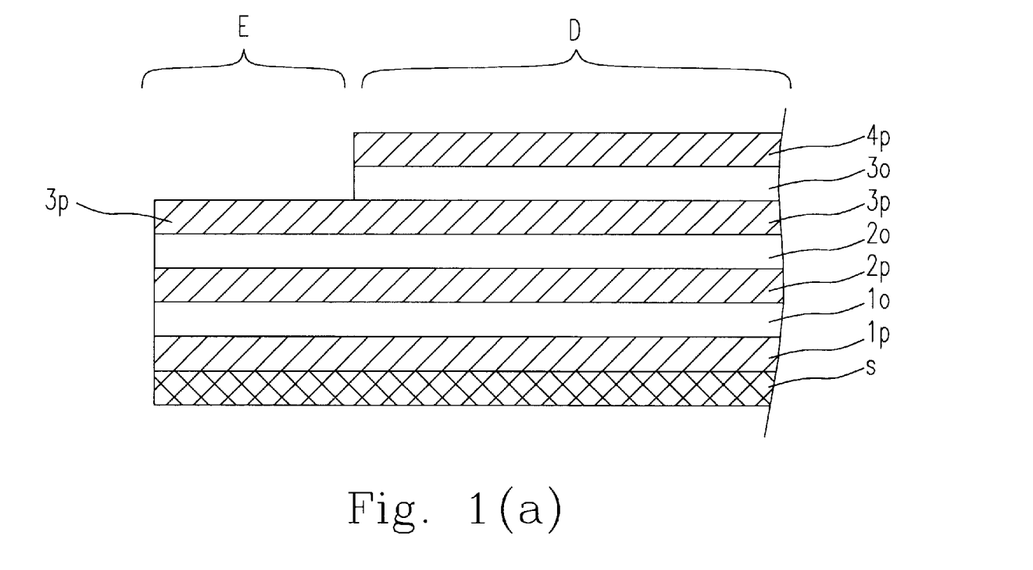
FIGS. 1(a)–(f) is a schematic diagram showing a preferred embodiment of a contact plug manufacturing process according to the present invention.

Referring to FIG. 1(a), chemical vapor deposition (CVD) method is executed to form a first conducting layer 1P, a first dielectric layer 1O, a second conducting layer 2P, a second dielectric layer 2O, a third conducting layer 3P, a third dielectric layer 3O, and a fourth conducting layer 4P respectively on substrate S of a wafer. The dielectric layers 1O, 2O, and 3O are selected among a silicon dioxide ($SiO_2$) layer, a phosphosilicate glass (PSG) layer, a borophosphosilicate glass (BPSG) layer, a thermal oxide layer, and a non-doped silicate glass (NSG) layer. The conducting layers 1P, 2P, 3P, and 4P are polysilicon layers. There are two regions on the wafer. They are device area D and edge area E respectively. The present invention brings the edge area E into focus.

Figure 1B:
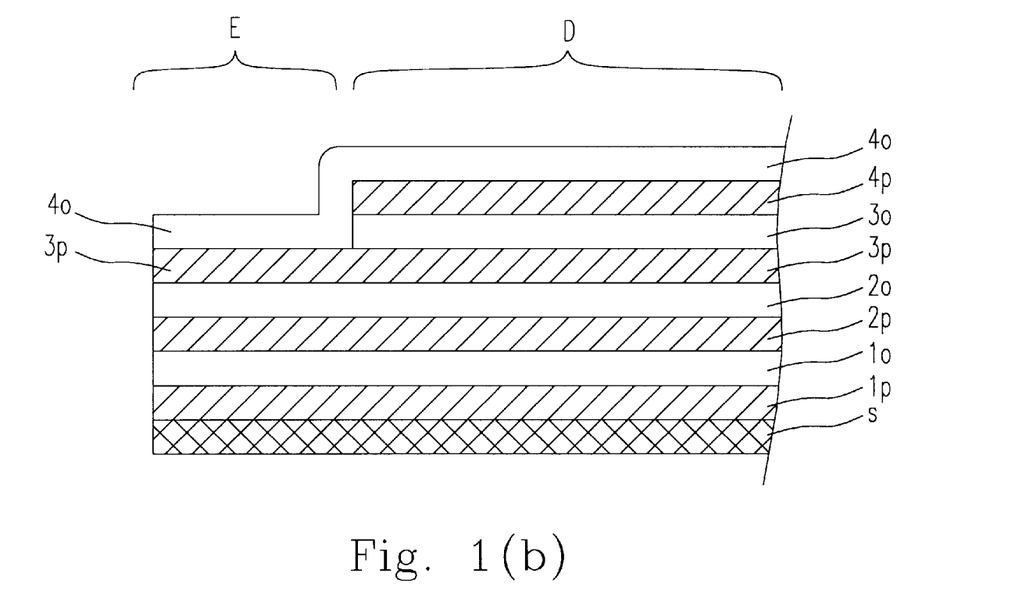
Figure 1C:
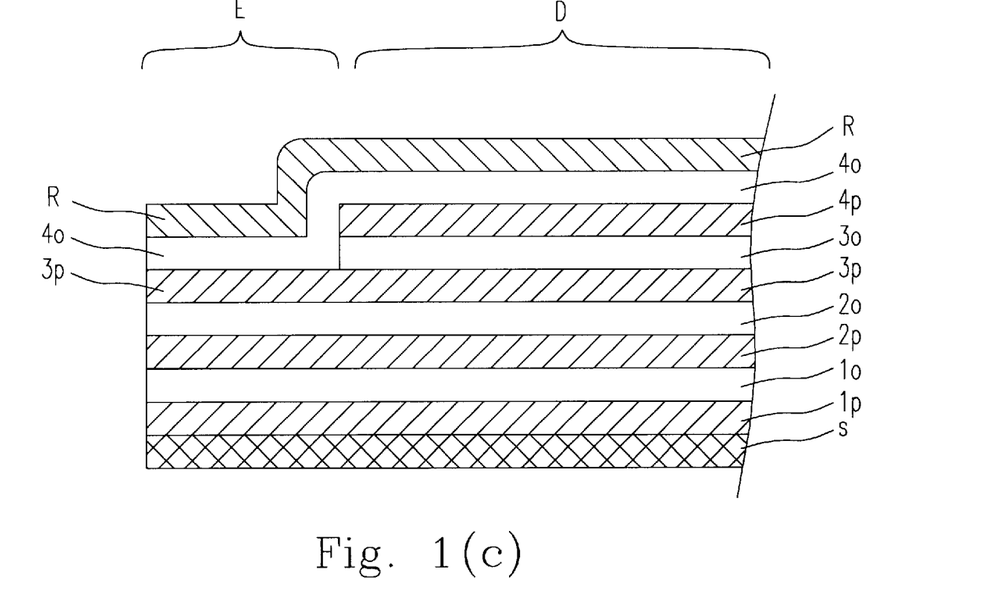

FIGS. 1(b) and 1(c) indicate the forming of a fourth dielectric layer 4O and a photoresist layer R on both areas D and E.

Figure 1D:
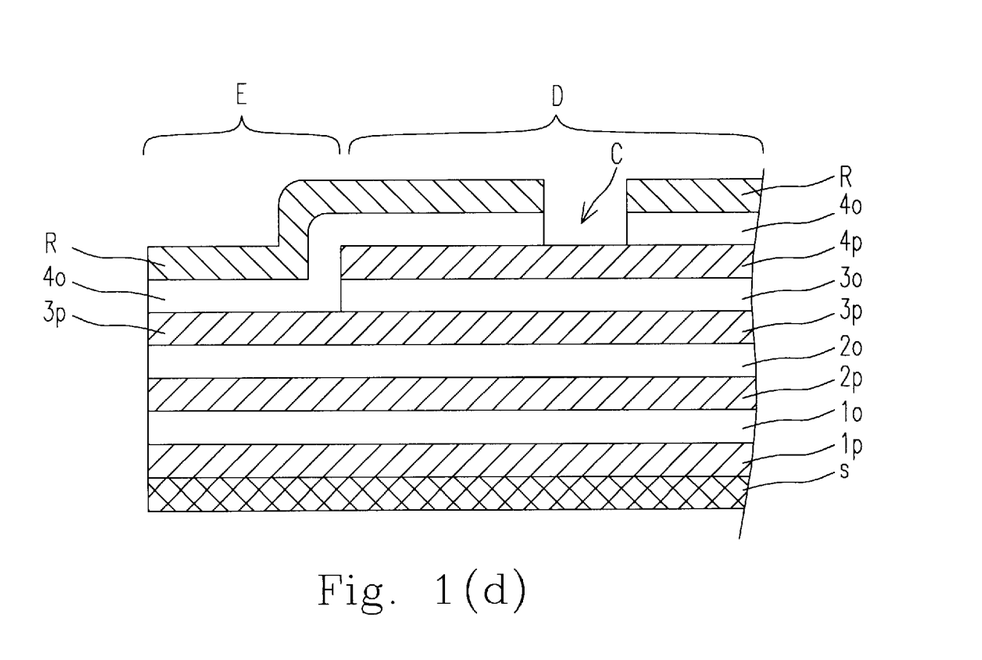

FIG. 1(d) shows the next steps. A photolithography and etching procedure such as dry etching is executed to etch the fourth dielectric layer 4O to form a contact hole C on device area D. The key point is to leave the fourth dielectric layer 4O on edge area E.

Figure 1E:
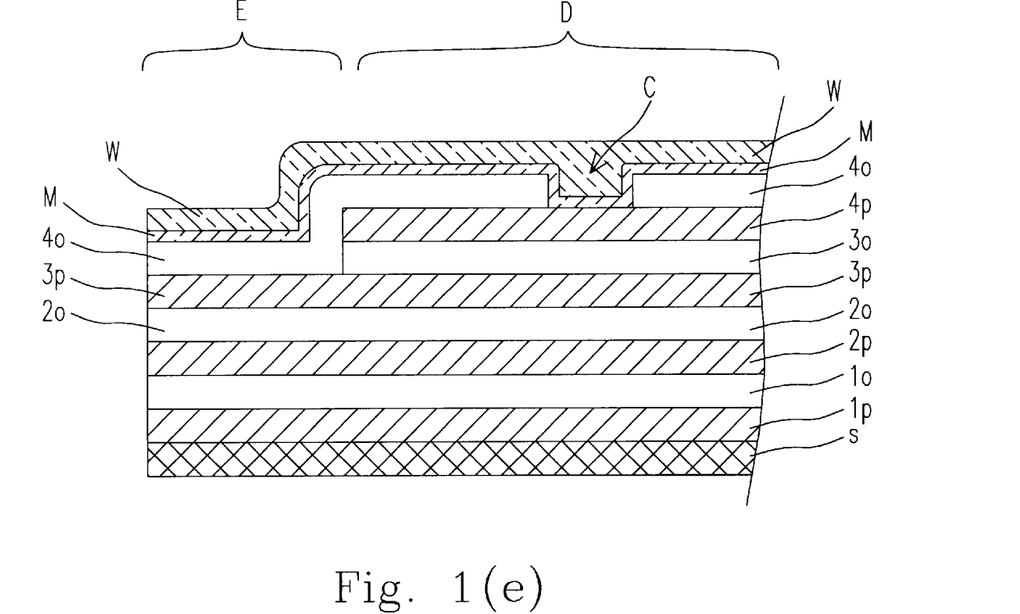
Figure 1F:
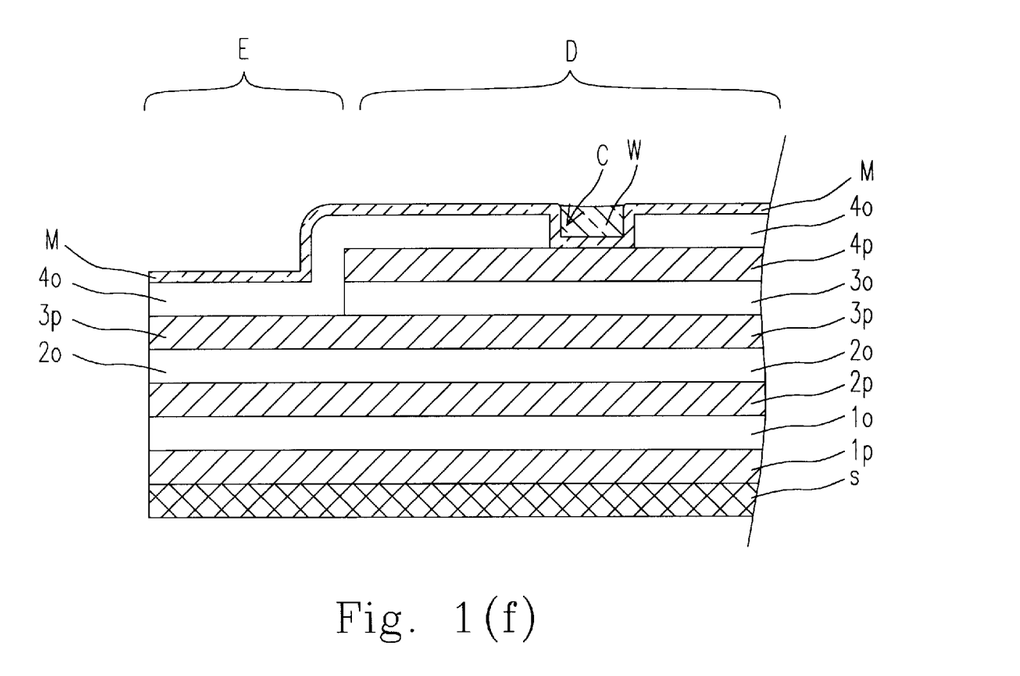

FIGS. 1(e) and 1(f) indicate the removing of the remaining photoresist layer on both areas D and E. Then magnetron DC sputtering and blanket tungsten deposition method are executed to form a metal film M and a tungsten film W on both areas D and E. This metal film M is selected as titanic or titanic/titanium nitride (Ti/TiN) film. And this titanium nitride film is formed by rapid thermal nitridation (RTN) or reactive sputtering deposition procedure. At last, execute a etchback procedure to form a contact plug in the contact hole C.

As stated above, the difference between conventional technique and present invention is to make metal film M break contact with the third conducting layer 3P on edge area E. Titanic film will react with the third conducting layer 3P to form titanium silicide ($TiSi_2$) film, and titanium silicide has much different thermal expansion coefficient from dielectric materials. During thermal treat process, titanium silicide film and titanic film peel off dielectric layer on edge area E. Introducing the fourth dielectric layer 4O solves this problem properly.

EXAMPLE 2.

Figure 2A:
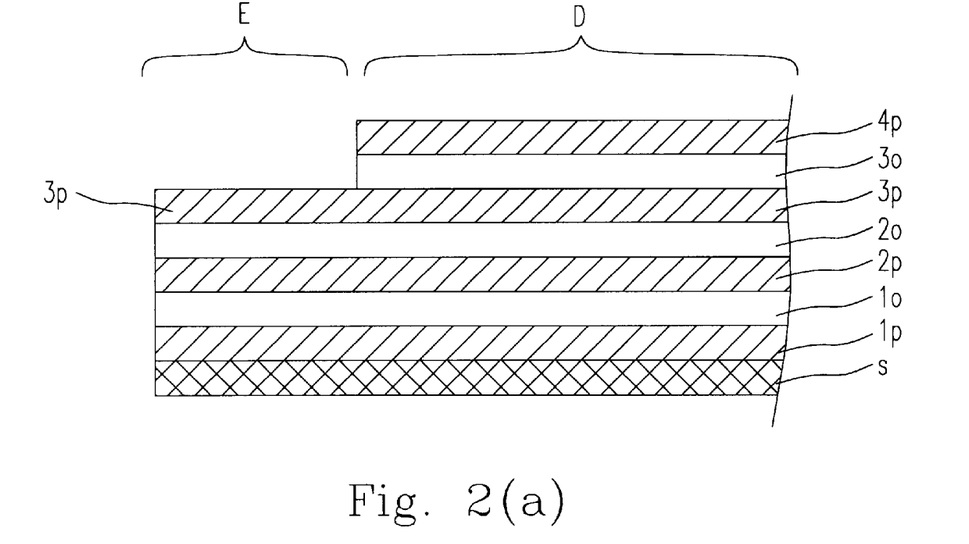
FIGS. 2(a)–(f) is a schematic diagram showing another preferred embodiment of a contact plug manufacturing process according to the present invention.
Figure 2B:
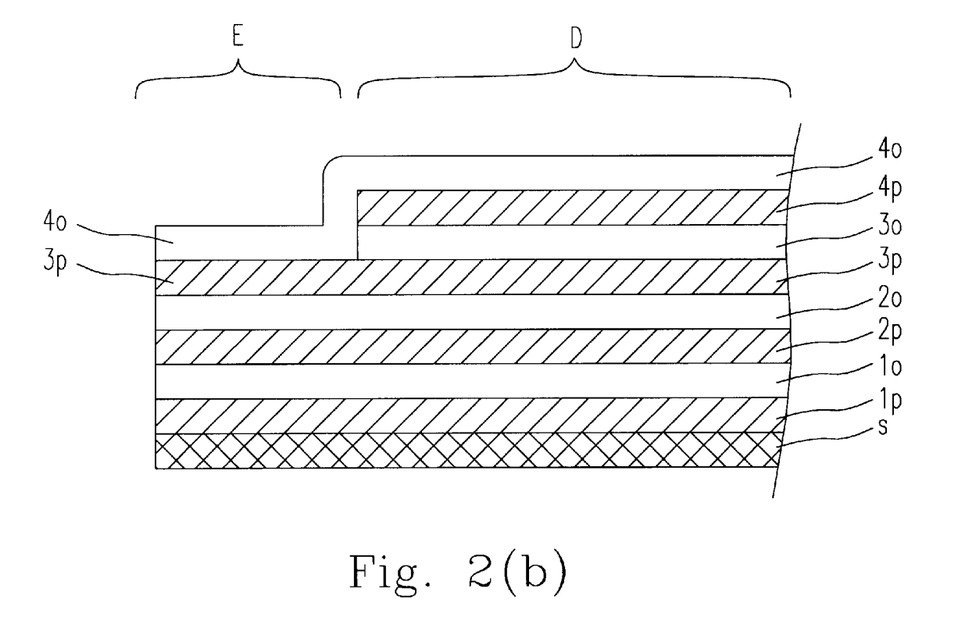
Figure 2C:
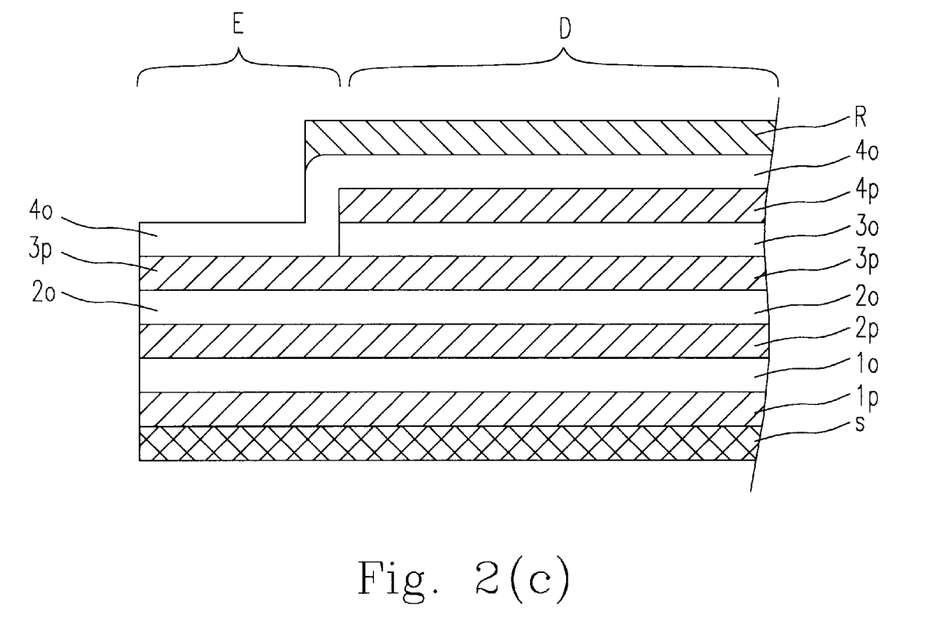

Similar to FIGS. 1(a) and 1(b), FIGS. 2(a) and 2(b) show a chemical vapor deposition method used to form dielectric layers 1O, 2O, 3O, and 4O and conducting layers 1P, 2P, 3P, and 4P on substrate S. FIG. 2(c) shows the forming of a photoresist layer R on both areas D and E and the stripping of the photoresist layer R on edge area E.

Figure 2D:
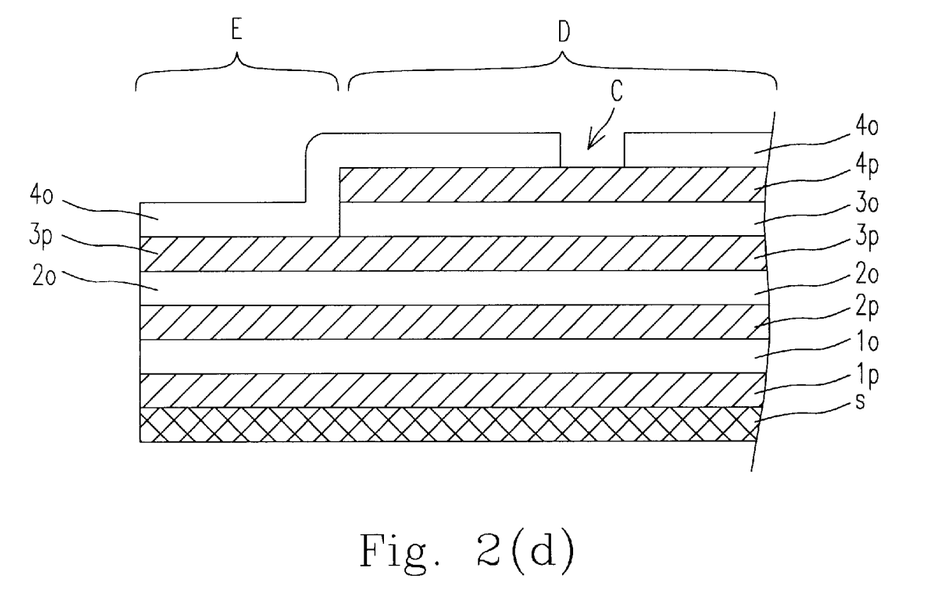

FIG. 2(d) illustrates the following steps. Executing a photolithography and etching procedure such as dry etching to etch the fourth dielectric layer 4O to form a contact hole C on device area D. An etcher with clamps is used to keep the fourth dielectric layer 4O on edge area E.

Corresponding to FIGS. 1(e) and 1(f), FIGS. 2(e) and 2(f) indicates the methods including magnetron DC sputtering, blanket tungsten deposition, and etchback to form a tungsten plug.

Figure 2E:
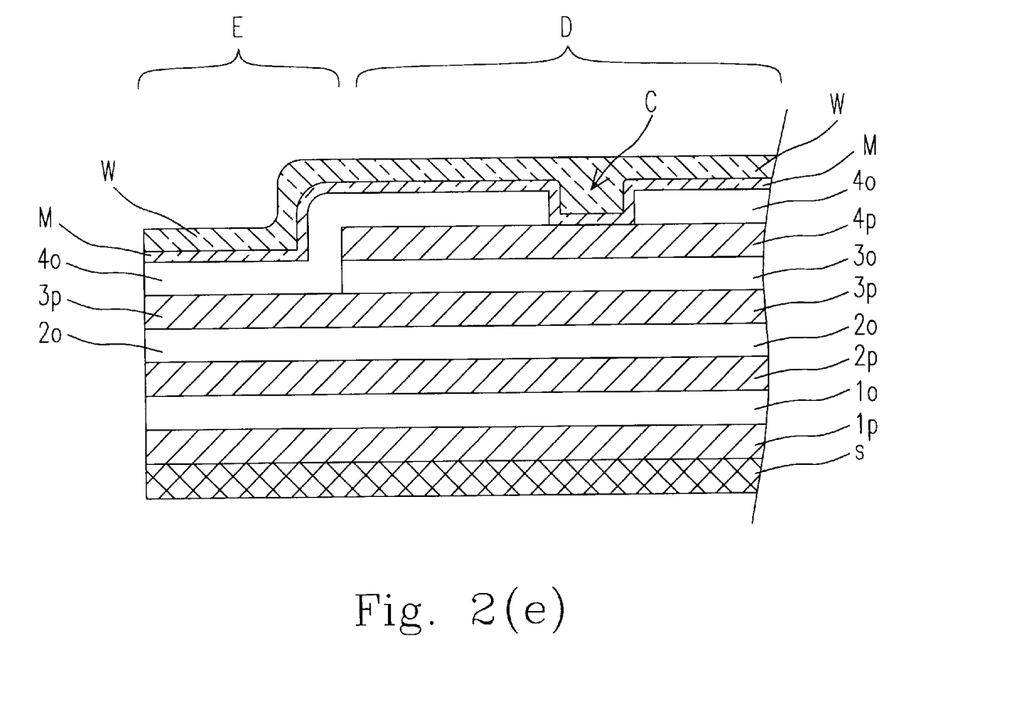
Figure 2F:
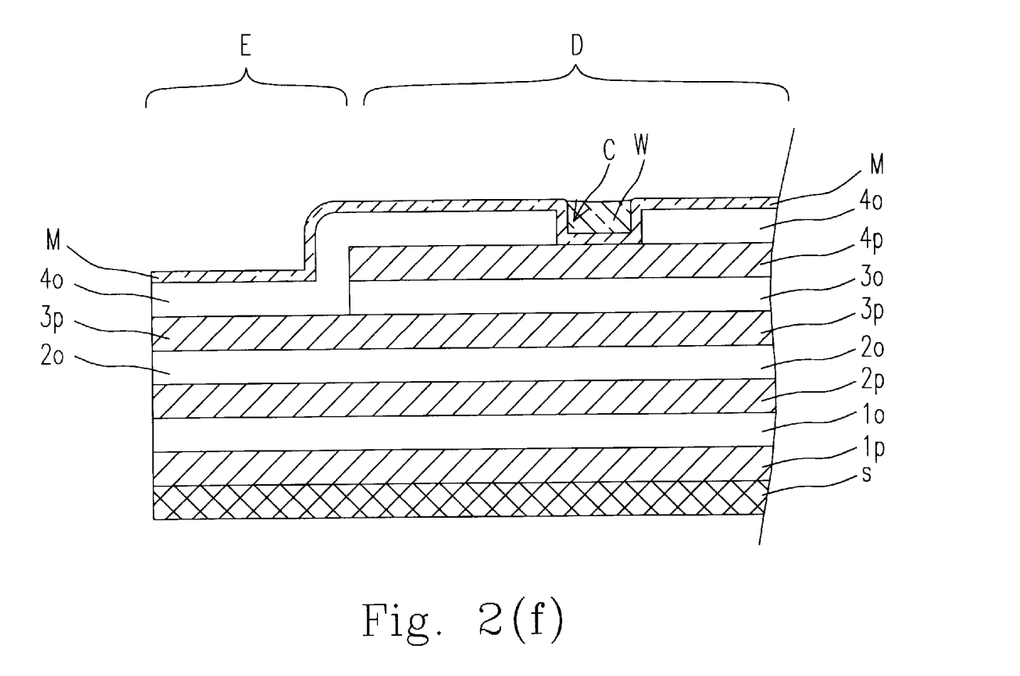

This example has the same effect as example 1. Metal film M has no contact with the third conducting layer 3P due to the introduction of the fourth dielectric layer 4O. Thus, the generation of titanium silicide layer is impossible in this case. Peeling on edge area E due to the generation of titanium silicide layer does not occur even during thermal treat process.

EXAMPLE 3.

Corresponding to FIGS. 2(a)–2(c), FIGS. 3(a)–3(c) show the forming of dielectric layers 1O, 2O, 3O, and 4O, conducting layers 1P, 2P, 3P, and 4P, and photoresist layer R on substrate S, and the removing of the photoresist layer R on edge area E.

Figure 3A:
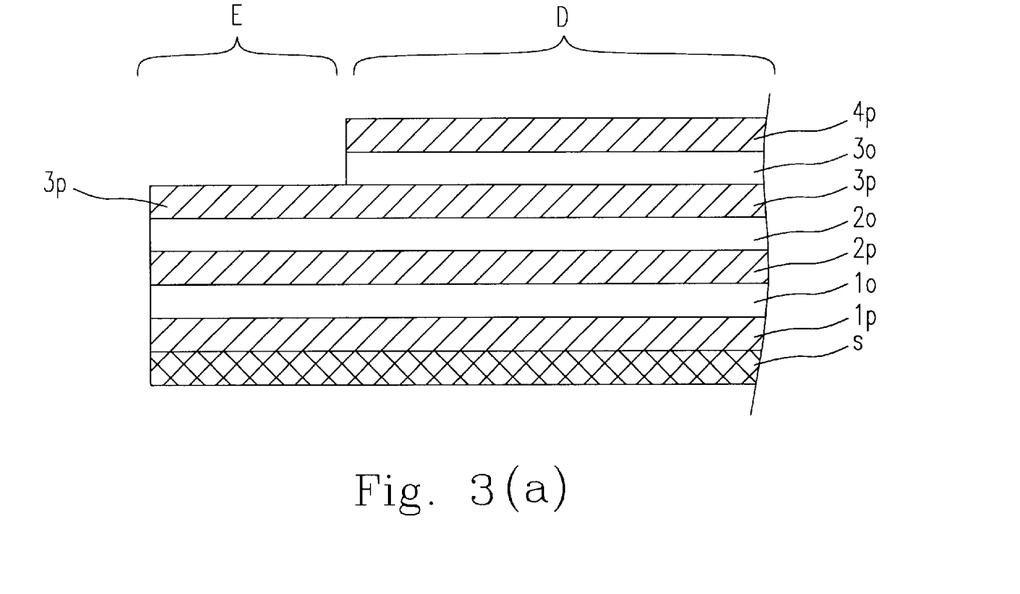
FIGS. 3(a)–(g) is a schematic diagram showing a third preferred embodiment of a contact plug manufacturing process according to the present inventing.
Figure 3B:
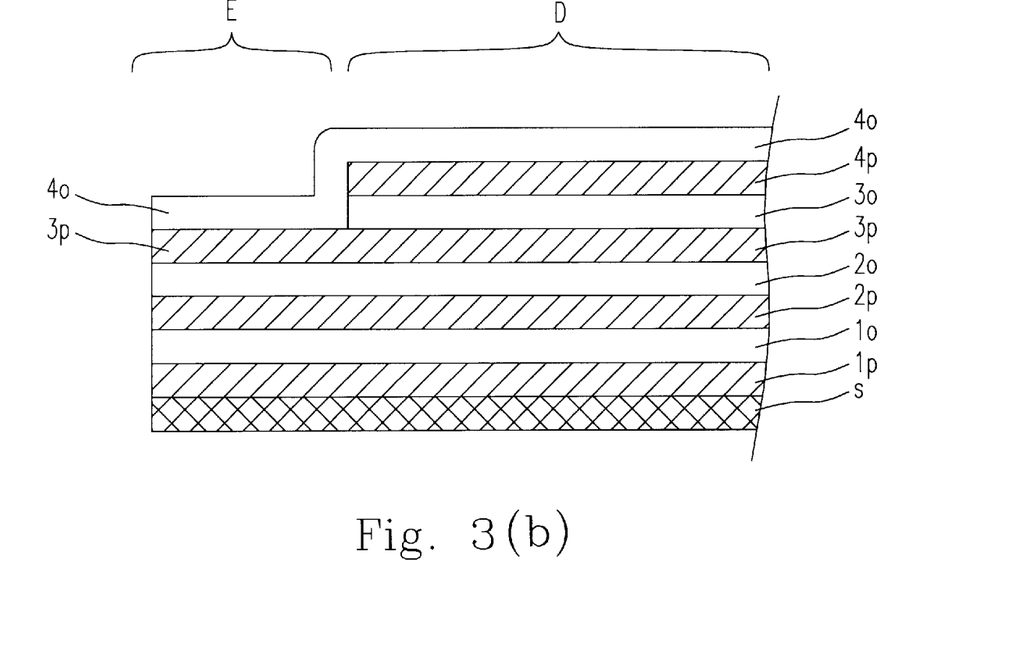
Figure 3C:
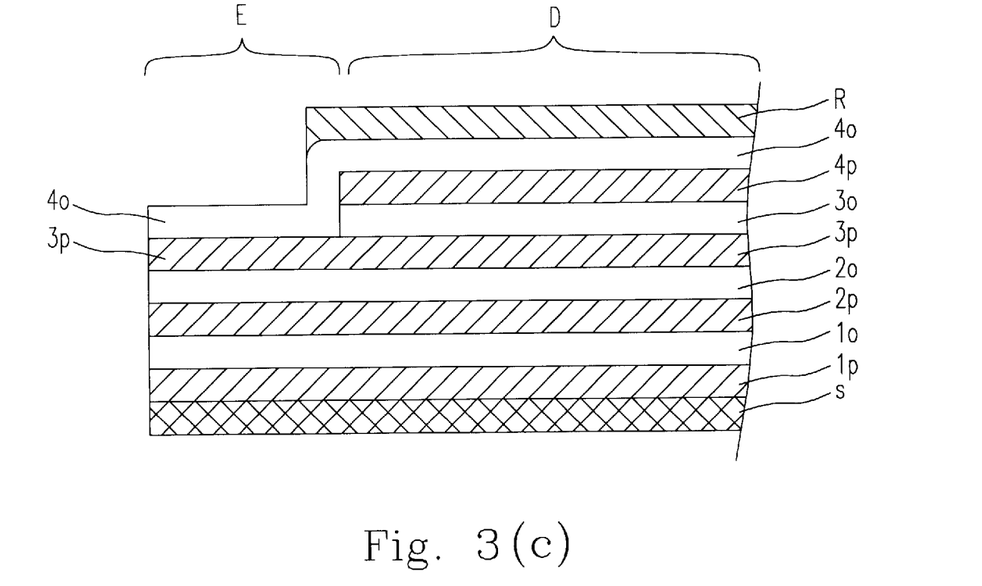
Figure 3D:
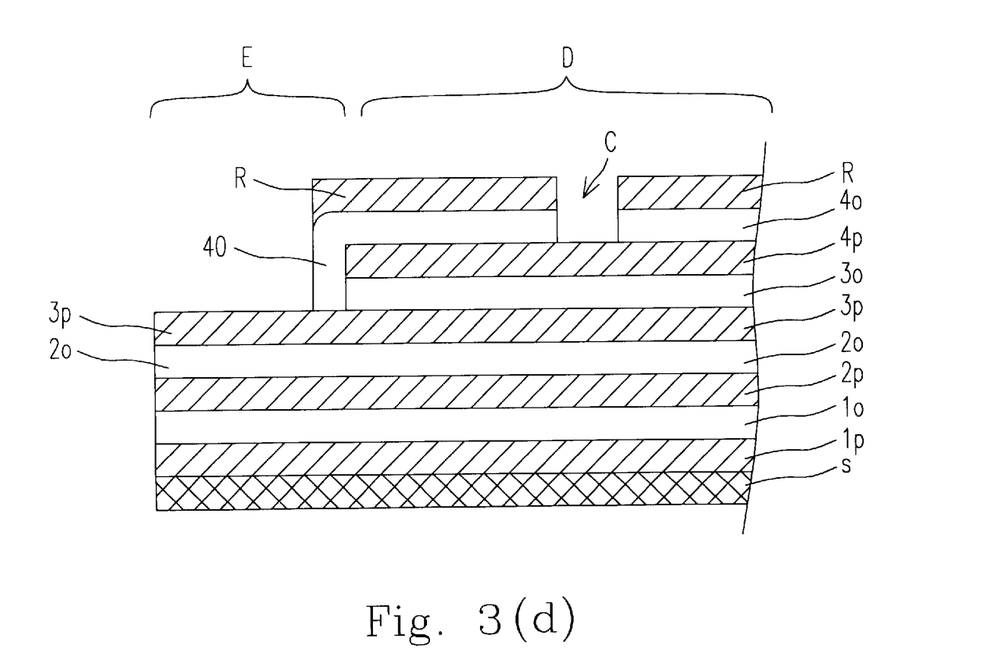
Figure 3E:
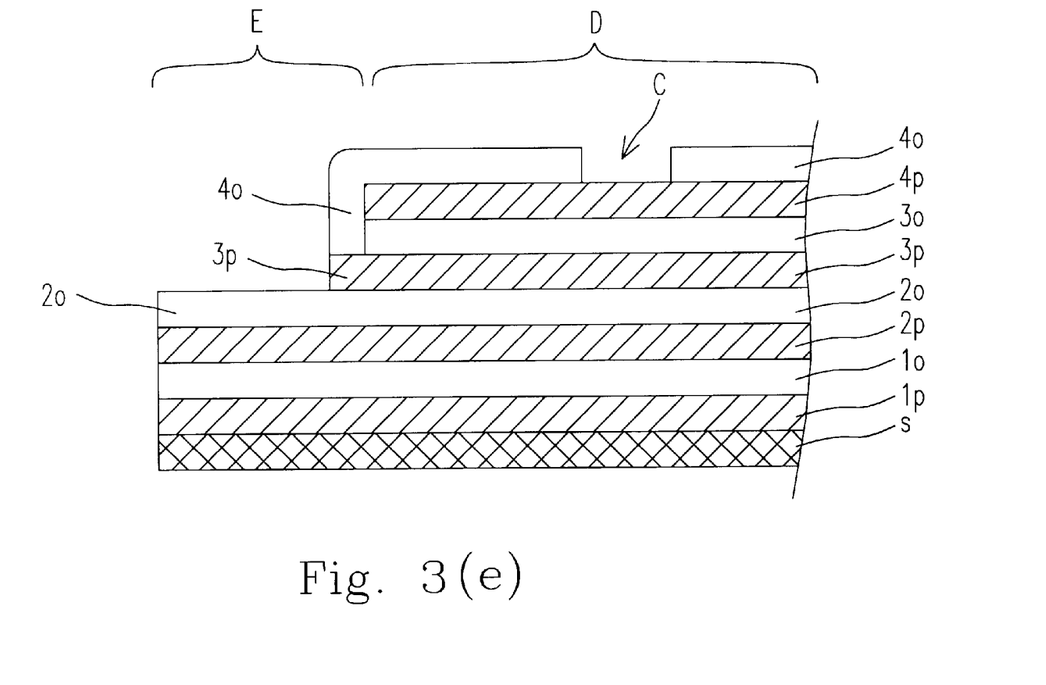

Shown in FIG. 3(d) is a photolithography and etching procedure such as dry etching executed to form a contact C on device area D and to remove the fourth dielectric layer 4O entirely on edge area E. An etcher without clamps is used in this case. FIG. 3(e) shows that a dry etching by means of a plasma etching technique using ozone ($O_3$) is executed to remove the photoresist layer R remained on the fourth dielectric layer 4O and the third conducting layer 3P on edge area.

Similar to FIGS. 1(e) and 1(f), FIGS. 3(f) and 3(g) indicate the methods including magnetron DC sputtering, blanket tungsten deposition, and etchback to form a tungsten plug.

Figure 3F:
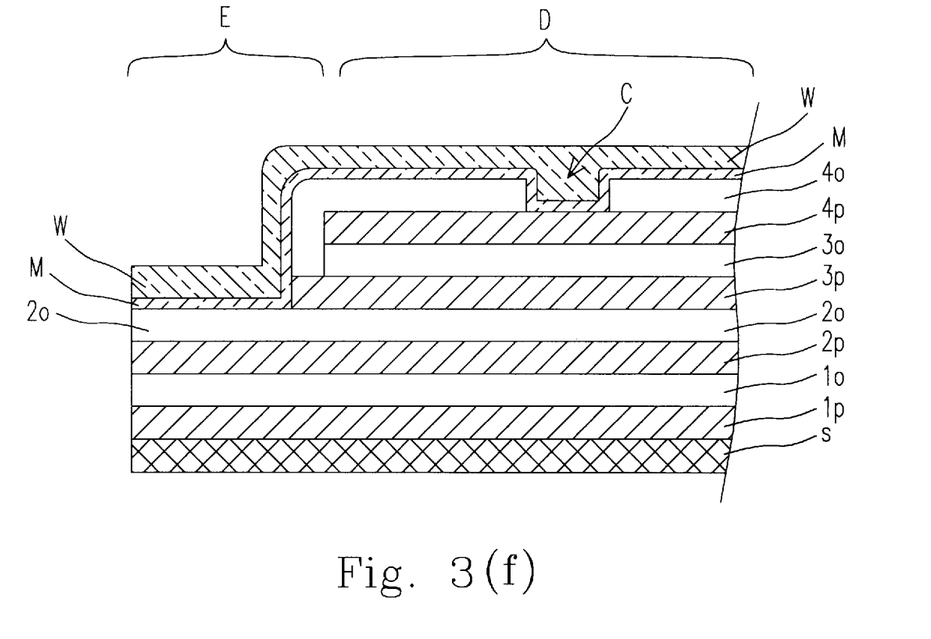
Figure 3G:
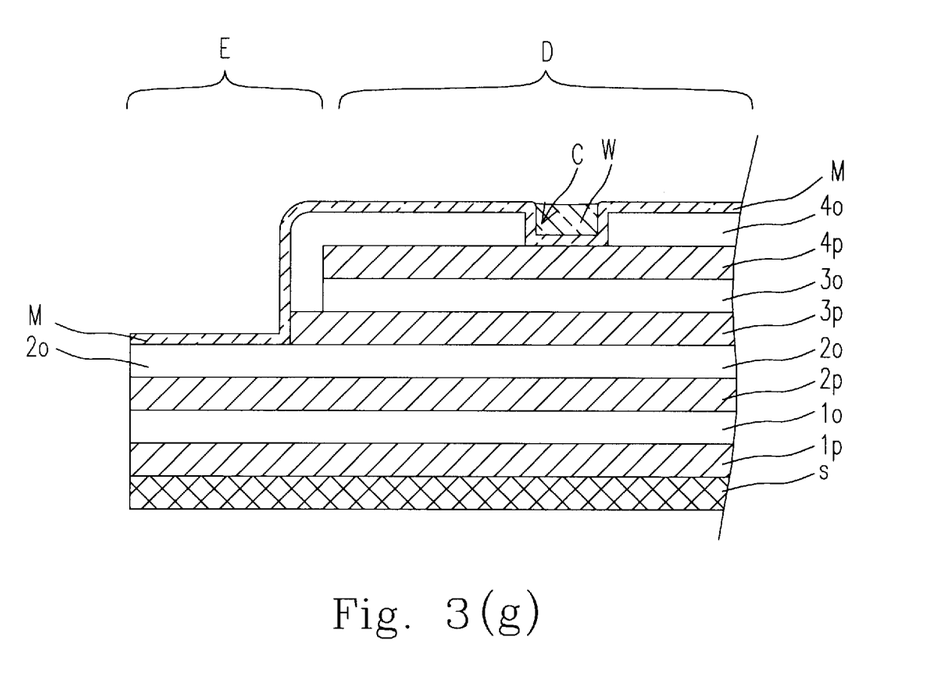

The difference between conventional technique and this sample is to make metal film M break contact with the third conducting layer 3P on edge area E. Titanic film will react with the third conducting layer 3P to form titanium silicide film, and titanium silicide has much different thermal expansion coefficient from dielectric materials. During thermal treat process, titanium silicide film and titanic film peel off dielectric layer on edge area E. Removing the third conducting layer 3P solves this problem properly.

EXAMPLE 4.

Figure 4A:
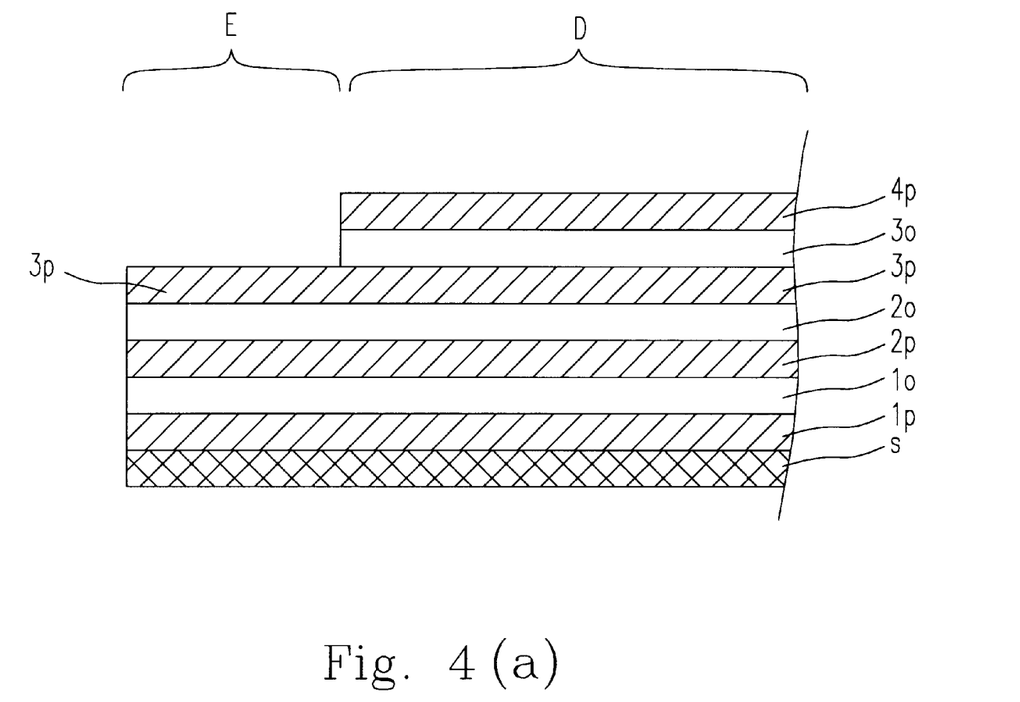
FIGS. 4(a)–(g) is a schematic diagram showing a fourth preferred embodiment of a contact plug manufacturing process according to the present invention.

Corresponding to FIG. 1(a), FIG. 4(a) shows a chemical vapor deposition method executed to form dielectric layers 1O, 2O, and 3O and conducting layers 1P, 2P, 3P, and 4P on substrate S.

Figure 4B:
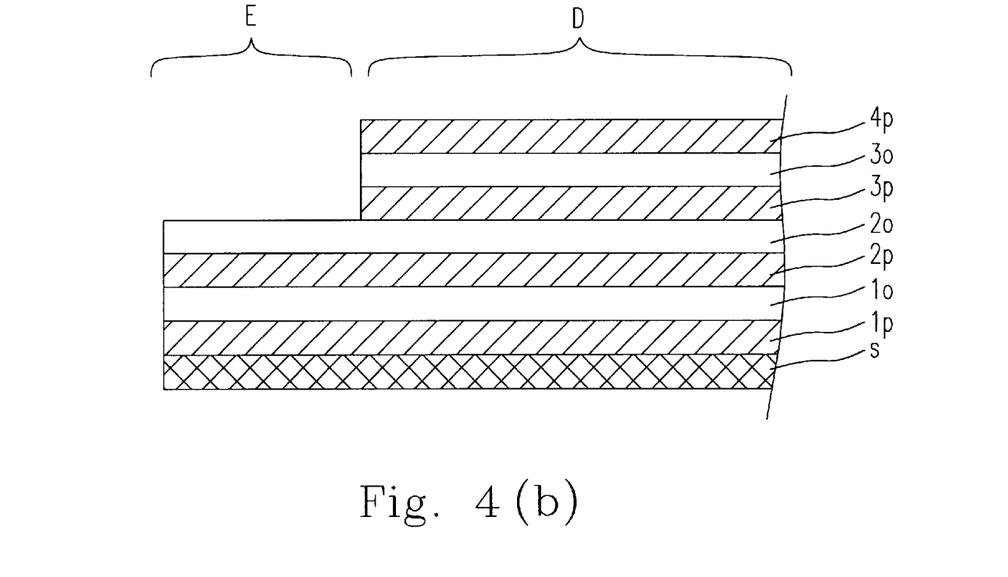
Figure 4C:
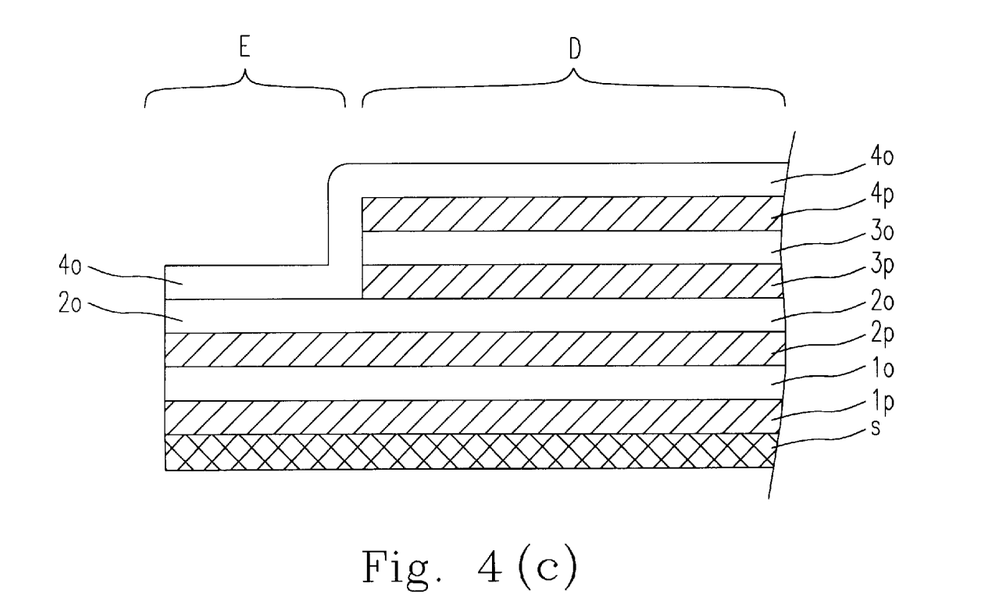

Shown in FIG. 4(b) is a dry etching procedure executed to remove the third conducting layer 3P on edge area E, and in FIG. 4(c) is the chemical vapor deposition executed to form the fourth dielectric layer 4O on both areas D and E.

Figure 4D:
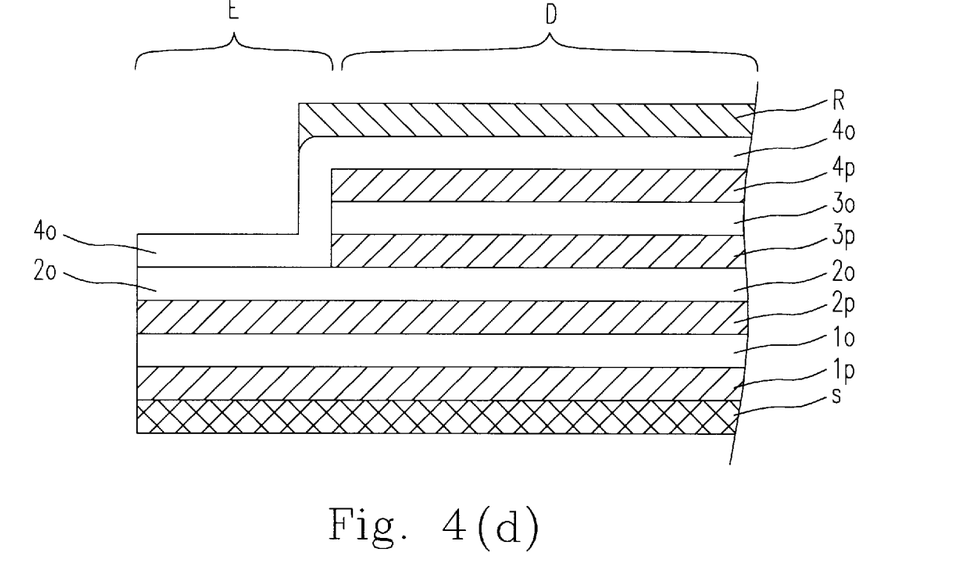
Figure 4E:
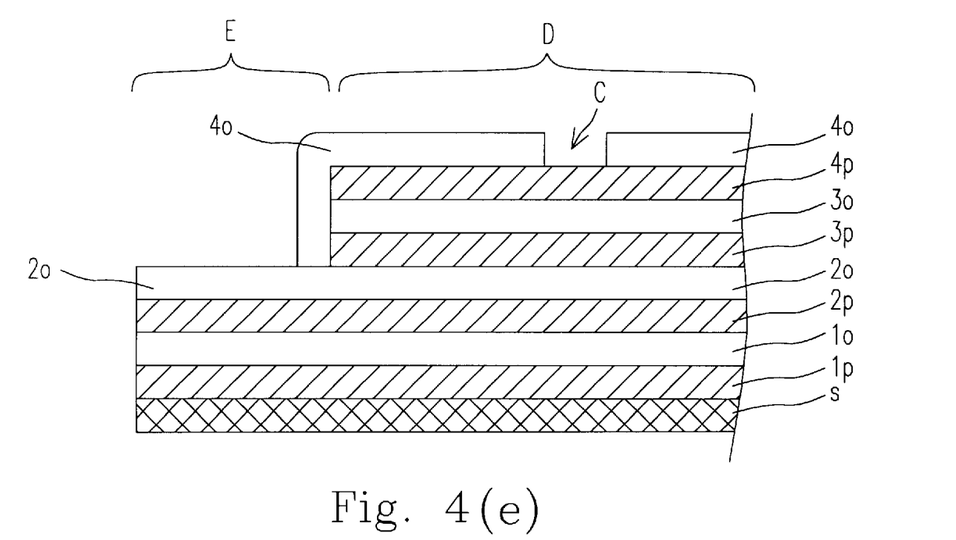

FIG. 4(d) shows the steps of forming a photoresist layer R over the fourth dielectric 4O, and stripping the photoresist layer R over the fourth dielectric 4O on edge area E. Corresponding to FIG. 3(d), FIG. 4(e) indicates that a photolithography and etching procedure such as dry etching is executed to form a contact hole C on device area D and to remove the fourth dielectric layer 4O entirely on edge area E. An etcher without clamps is used in this case.

Corresponding to FIGS. 1(e) and 1(f), FIGS. 4(f) and 4(g) indicate the methods including magnetron DC sputtering, blanket tungsten deposition, and etchback to form a tungsten plug.

Figure 4F:
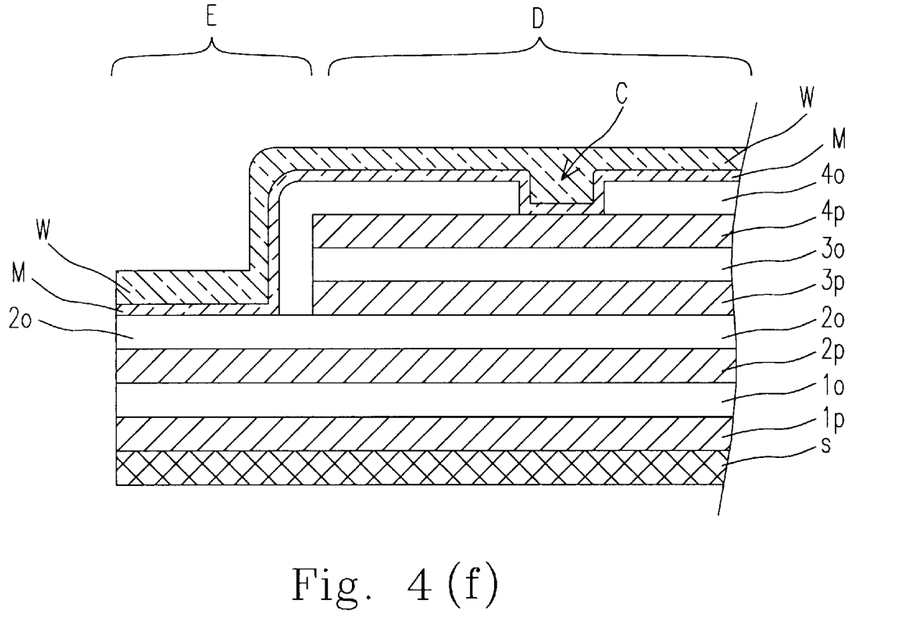
Figure 4G:
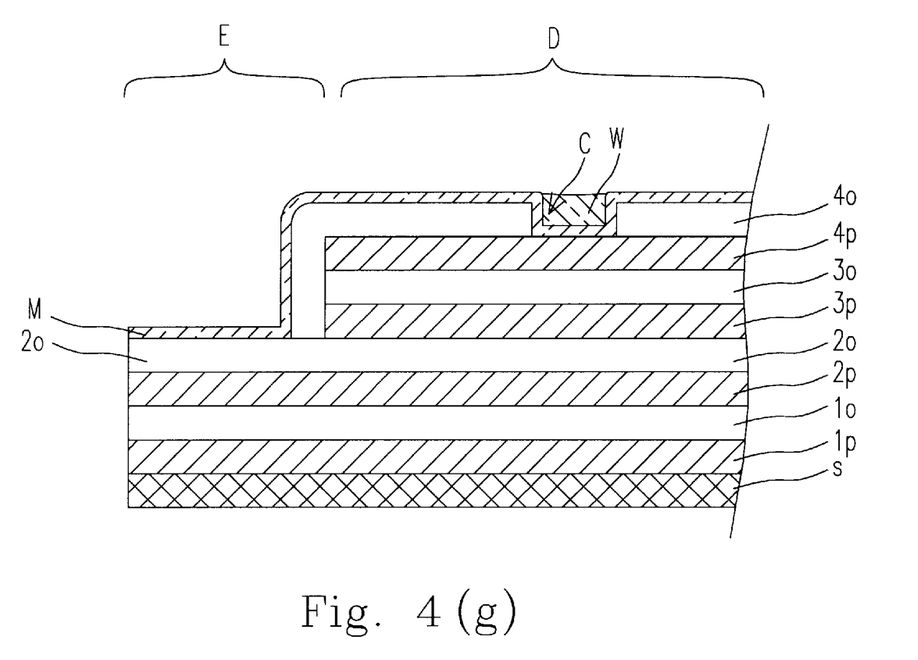

This example has the same effect as example 3. The metal film M has no contact with the third conducting layer 3P due to the removing of the third conducting layer 3P on edge area E. The generation of titanium silicide layer is impossible in this case. Peeling on edge area E due to the generation of titanium silicide layer does not occur even during thermal treat process.

In conclusion, Peeling of raw materials due to different thermal expansion coefficient will contaminate the whole system and the present invention is thus developed to prevent the contamination. Insulating metal film from contacting with conducting layer or removing the conducting layer, as suggested by the present invention, can solve this problem well. Present invention also provides a procedure without need of equipment rearrangement inherent in conventional technique. This invention is practicable in terms of the concern for production cost and quality control.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for forming a device on a wafer without peeling, said wafer having a substrate forming thereon a first dielectric layer forming thereon a first conducting layer having thereon a first device area and an edge area, comprising:
   a) forming a second dielectric layer on said first device area and said edge area;
   b) forming a photoresist layer on said second dielectric layer;
   c) selectively removing said second dielectric layer, said photoresist layer, and said first conducting layer from and presenting thereby said first device area and said edge area with a desired dielectric layer; and
   d) forming a metal film on said first device area and said edge area.

2. A method according to claim 1 wherein said step c) includes the following sub-steps:
   c1) executing a photolithography and etching procedure to etch said second dielectric layer on said first device area; and
   c2) removing the remaining photoresist layer on said first device area and said edge area.

3. A method according to claim 1 wherein said first dielectric layer is one selected from a group consisting of a silicon dioxide ($SiO_2$) layer, a phosphosilicate glass (PSG) layer, a borophosphosilicate glass (BPSG) layer, a thermal oxide layer, and a non-doped silicate glass (NSG) layer.

4. A method according to claim 1 wherein said first conducting layer is a polysilicon layer.

5. A method according to claim 1 wherein said first device area is defined by said first conducting layer forming thereon a third dielectric layer forming thereon a second conducting layer forming thereon said second dielectric layer.

6. A method according to claim 1 wherein said step a) is executed by a chemical vapor deposition (CVD) method.

7. A method according to claim 1 wherein in said step c), said second dielectric layer is removed by a dry etching.

8. A method according to claim 1 wherein said first device area forms thereon a contact hole by etching said second dielectric layer.

9. A method according to claim 8 wherein said contact hole is covered by said metal film.

10. A method according to claim 9 wherein said metal film is titanic.

11. A method according to claim 10 wherein said titanic film is formed by a magnetron DC sputtering.

12. A method according to claim 10, further comprising after said step d) a step of e) forming a titanium nitride (TiN) film on said titanic film.

13. A method according to claim 12 wherein said titanium nitride film is formed by one of a rapid thermal nitridation (RTN) procedure and a reactive sputtering deposition procedure.

14. A method according to claim 8, further comprising after said step d) a step of forming a contact plug in said contact hole.

15. A method according to claim 14 wherein said contact plug is a tungsten plug.

16. A method according to claim 15 wherein said tungsten plug is formed by one of a blanket tungsten deposition and a selective tungsten deposition.

17. A method according to claim 1, further comprising a second device area provided between said first dielectric layer and said substrate.

18. A method according to claim 17 wherein said second device area is defined by said substrate forming thereon a third conducting layer forming thereon a fourth dielectric layer forming thereon a fourth conducting layer forming thereon said first dielectric layer.

19. A method according to claim 1 wherein said step c) further includes the following sub-steps:
   c3) removing said photoresist layer on said second dielectric layer on said edge area; and
   c4) executing a photolithography and etching procedure to etch said second dielectric layer on said first device area with an etcher having a clamp in order to maintain said second dielectric layer on said edge area.

20. A method according to claim 1 wherein said step c) further includes the following sub-steps:
   c5) removing said photoresist layer on said second dielectric layer on said edge area;
   c6) executing a photolithography and etching procedure to etch said second dielectric layer on said first device area and said edge area; and
   c7) simultaneously etching away said photoresist layer remained on said second dielectric layer and said first conducting layer on said edge area.

21. A method according to claim 20 wherein said step c7) is executed by a dry etching by means of a plasma etching technique using ozone ($O_3$).

22. A method for forming a device on a wafer without peeling, said wafer having a substrate forming thereon a first dielectric layer forming thereon a first conducting layer having thereon a device area and an edge area, comprising:

a) removing said first conducting layer on said edge area;

b) forming a second dielectric layer on said device area and said edge area;

c) forming a photoresist layer on said second dielectric layer;

d) removing said photoresist layer on said second dielectric layer on said edge area;

e) executing a photolithography and etching procedure to etch said second dielectric layer; and f) forming a metal film on said device area and said edge area.

23. A method according to claim 22 wherein said step a) is executed by a dry etching.

* * * * *